United States Patent [19]
Bulsterbaum et al.

[11] Patent Number: 5,186,597
[45] Date of Patent: Feb. 16, 1993

[54] APPARATUS FOR SERVICING OF SEMICONDUCTOR MANUFACTURING EQUIPMENT

[75] Inventors: J. Charles Bulsterbaum; Robert D. Tolles; Donald A. Costello, all of Austin, Tex.

[73] Assignees: Sematech, Inc., Austin, Tex.; NCR Corporation, Dayton, Ohio

[21] Appl. No.: 749,016

[22] Filed: Aug. 23, 1991

[51] Int. Cl.⁵ ............................................ B65G 67/02
[52] U.S. Cl. .................................... 414/469; 296/27; 414/470
[58] Field of Search ............................... 414/470, 469; 280/79.11, 47.35; 296/27, 36, 102, 165, 196; 269/17

[56] References Cited

U.S. PATENT DOCUMENTS

| | | | |
|---|---|---|---|
| 2,976,033 | 3/1961 | Martin | 269/17 |
| 3,149,878 | 9/1964 | Heermann | 296/102 |
| 3,173,708 | 3/1965 | Machielse et al. | 280/79.11 X |
| 3,837,702 | 9/1974 | Case | 296/36 |
| 3,930,680 | 1/1976 | Littlefield | 296/36 X |
| 3,937,502 | 2/1976 | Gay | 414/470 X |
| 3,955,845 | 5/1976 | Werner | 296/36 X |
| 4,932,639 | 6/1990 | Fjellstrom | 269/17 |
| 5,016,935 | 5/1991 | Semple | 296/27 X |

Primary Examiner—David A. Bucci
Attorney, Agent, or Firm—William W. Kidd

[57] ABSTRACT

A mobile container cart includes a pivoting mechanism for pivoting the container from a horizontal position to approximately 85-90 degree vertical position. The container rests atop the cart and has removable side and top plates. A semiconductor processing equipment assembly is loaded into the container while still hot. The container is sealed and pivoted to its vertical position for transport. Once at a servicing area, the container is repositioned horizontally and the top and side plates are removed. The cart now functions as a work bench for disassembling, servicing and reassembling the device. Diagnostics can be performed while the device is in the service area.

17 Claims, 6 Drawing Sheets

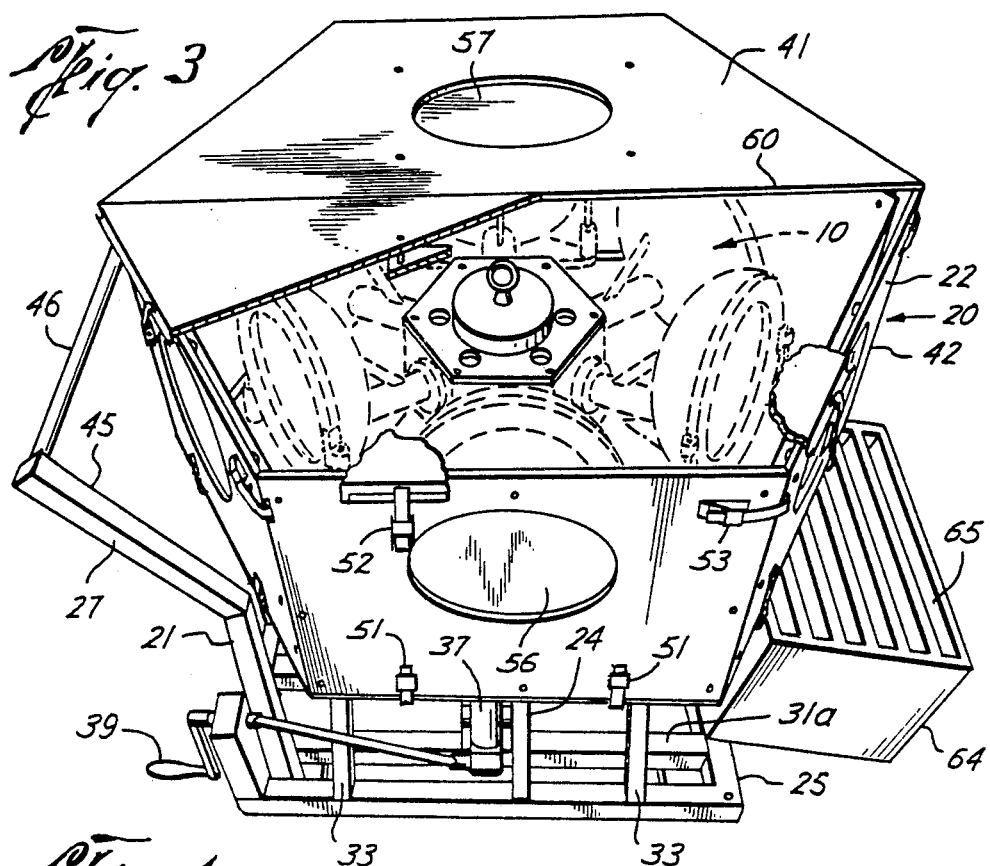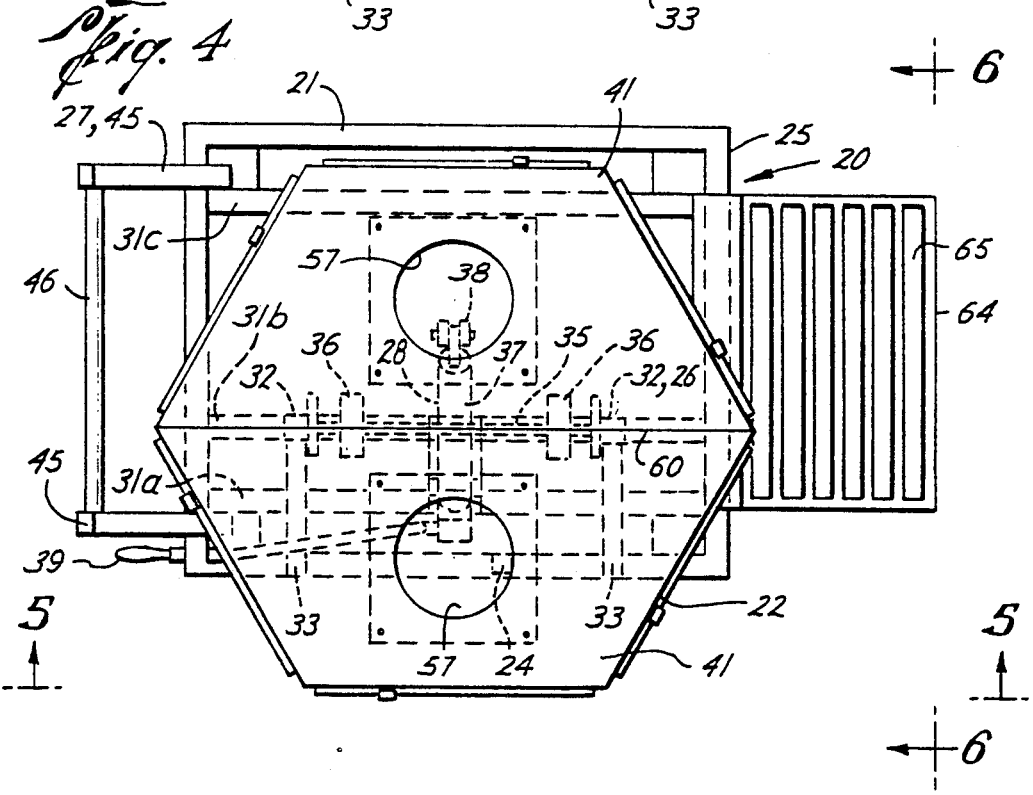

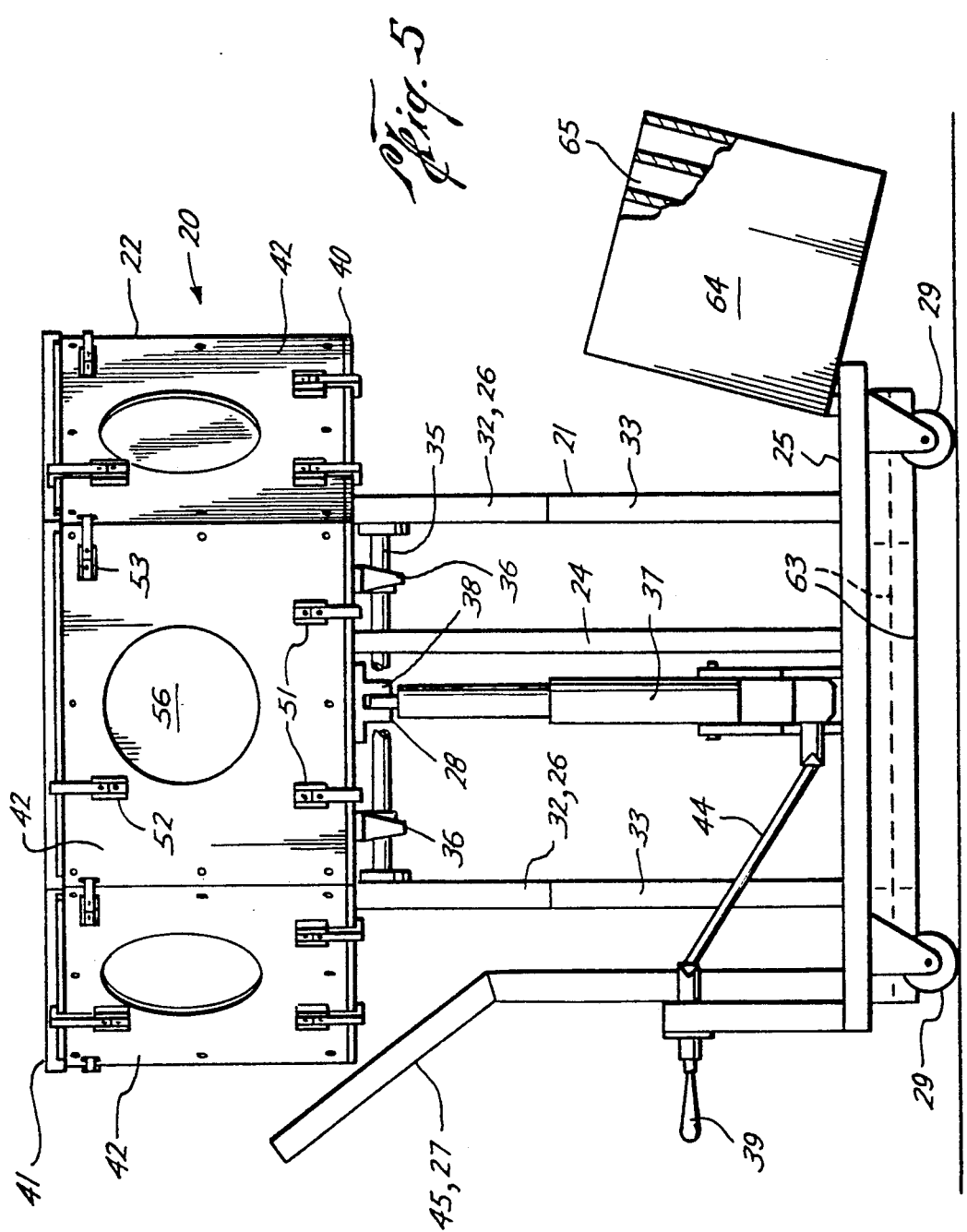

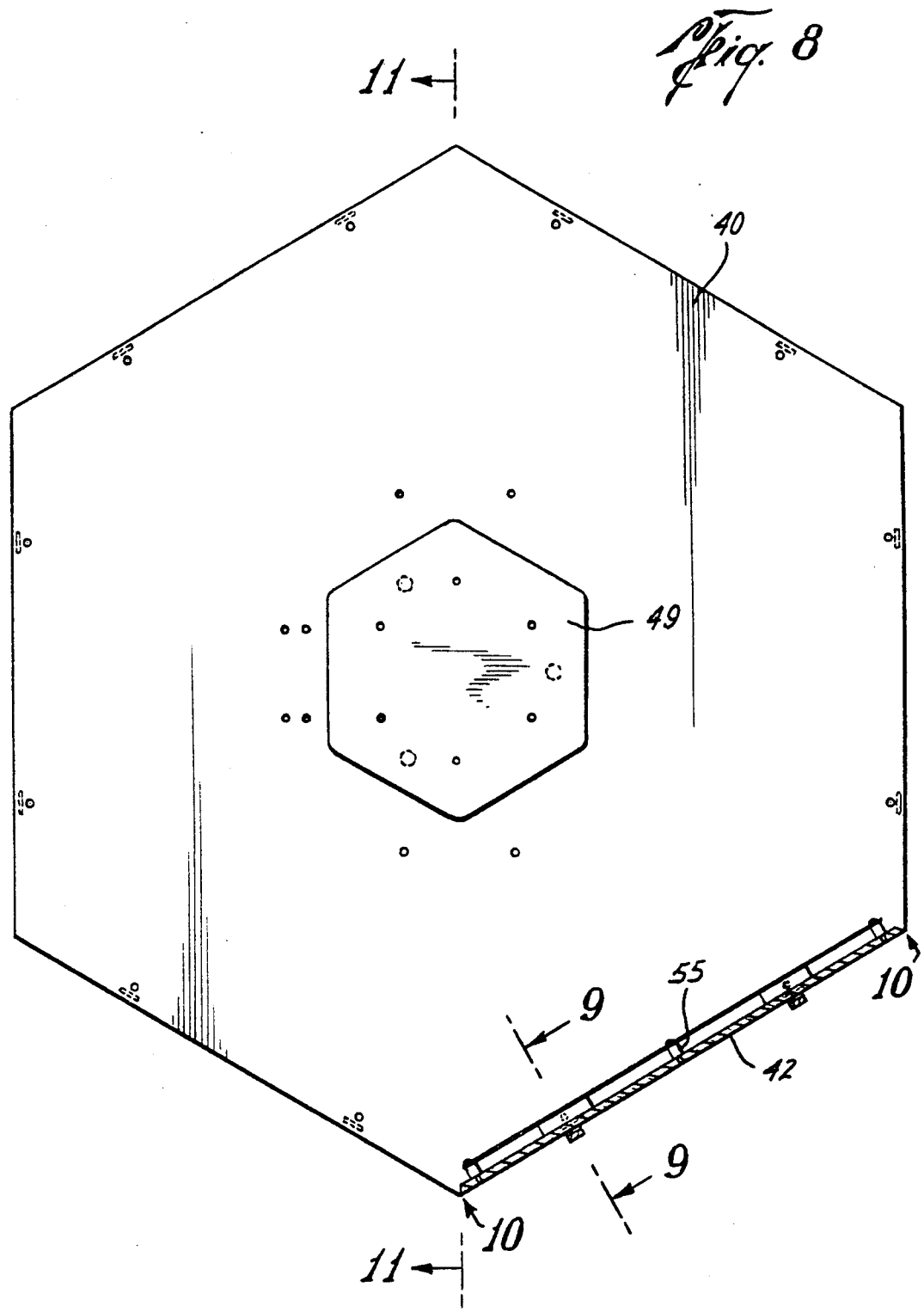

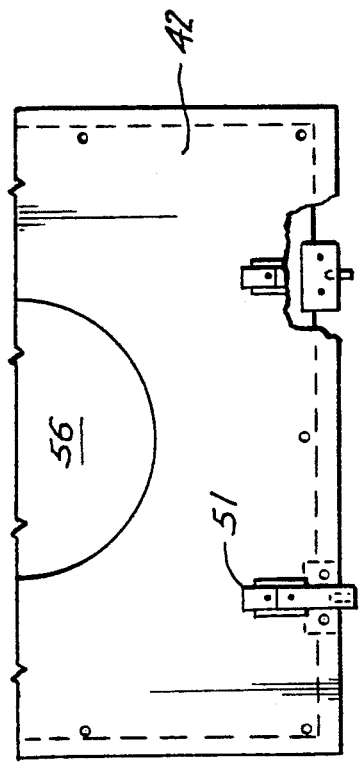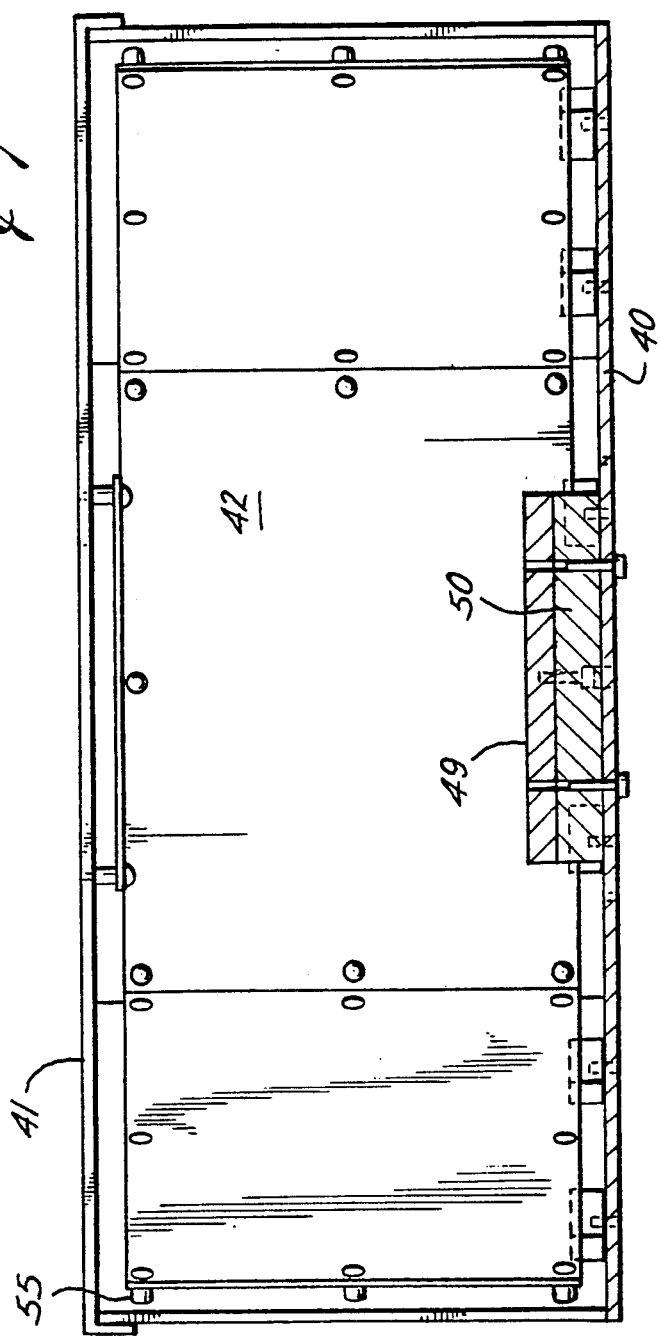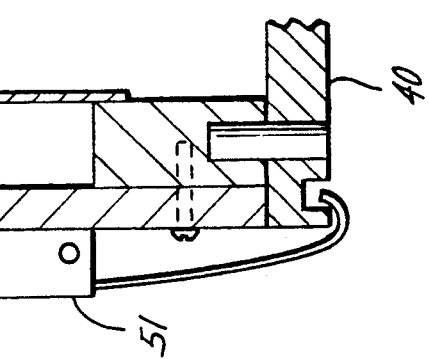

APPARATUS FOR SERVICING OF SEMICONDUCTOR MANUFACTURING EQUIPMENT

BACKGROUND OF THE INVENTION

1. Field of the Invention

The present invention relates to the field of semiconductor manufacturing equipment and, more particularly, to a container cart for use in a cleanroom environment.

2. Prior Art

In the manufacture of VLSI and ULSI semiconductor integrated circuit devices, it is essential that the cleanroom environment in which these devices are fabricated be kept as clean as possible. This is especially important in the instance where these semiconductor "chips" have device or interconnecting line dimensions of less than one micron. Since these submicron dimensioned devices are fabricated in a cleanroom environment on the order of Class 1 or better, it is imperative that any contamination causing activity be either removed or isolated from the immediate processing area. A cleanroom is rated Class 1 if it contains no more than one 0.5 micron or larger particle per one cubic foot of space.

One technique being employed in today's "cleanrooms" is to physically isolate the maintenance operation from the chip fabrication operation. In order to achieve this, today's cleanrooms incorporate maintenance corridors which are physically separated from the portion of the cleanroom where the chip fabrication occurs. The various chip processing equipment is then positioned so that the front of the equipment, which is utilized for chip manufacturing, faces the fabrication environment, while the back of the equipment resides in or faces the maintenance corridor. When this particular equipment requires servicing, maintenance personnel will access and service the equipment from the maintenance corridor so that any contaminants introduced or dislodged by this servicing activity will be retained in the maintenance corridor and will not be introduced into the chip manufacturing side of the cleanroom.

However, although this is a sound technique for reducing the possibility of contaminating the cleanroom environment, there are instances when this approach is not workable. In some instances, a particular servicing task for the equipment requires entry to or within the chip fabrication environment. For example, when the front panel of the equipment needs to be removed for service access or, when the equipment resides completely within the fabrication environment, maintenance activities will be forced to coexist with chip fabrication.

In other instances, either preventative or corrective maintenance will require certain assemblies of a particular piece of equipment to be dismantled. The equipment being dismantled, can potentially introduce contaminants into the cleanroom. For example, in a particular piece of equipment used to deposit tungsten onto a semiconductor wafer, the wafer is subjected to very high temperatures in the range of 400°–490° C. The tungsten tends to deposit on the tooling and the chamber of the reactor. After prolonged use, this deposited tungsten residue needs to be removed from the reactor components. Because the equipment itself cannot be removed from the cleanroom environment without causing a major disruption of the fab operation, maintenance personnel typically dismantle the reactor components in the cleanroom in order to service the system. However, the reactor must necessarily be cooled down before maintenance personnel can physically dismantle the reactor assembly. One unfortunate result of permitting the equipment to be cooled to room temperature prior to performing the maintenance is that the residual tungsten deposited within the chamber tends to flake off. This results in the introduction of significant quantities of tungsten contaminants into the cleanroom environment.

Additionally, further contaminants are introduced into the cleanroom environment from the actions of the maintenance personnel in servicing the equipment. For example, tools and equipment which are typically stored outside of the cleanroom must necessarily be brought into the cleanroom, for not only the removal and repair of the assembly, but for required diagnostic functions after the assembly has been cleaned and replaced back in the equipment.

Thus, it is necessary that in such instances where the maintenance activity must occur in the cleanroom, additional care must be exercised to reduce or prevent contamination from occurring as a result of such activity. It is preferable to remove any portion of such activity from the cleanroom, if possible, in order to reduce the risk of cleanroom contamination. The present invention provides for an apparatus for permitting the bulk of the maintenance activity to be performed outside of the fabrication and/or the maintenance portion of the cleanroom.

SUMMARY OF THE INVENTION

A container cart for use in a cleanroom environment is described. The cart is comprised of a mobile support assembly which provides a container for housing an equipment assembly which is used for the processing of semiconductor wafers.

The support assembly includes a base frame member with horizontal support bars. Vertically extending stanchions support a pillow block and rod assembly which is affixed to the underside of a bottom plate for supporting the container housing assembly. A handle is provided at one end of the cart for manipulating and transporting the cart.

The housing assembly is comprised of a number of side plates. Each side plate is clamped to other adjacent side plates, as well as to the bottom plate. The total number of side plates will depend on the design for the particular equipment or assembly being serviced. A top cover plate is clamped onto the side plates to seal the container. The top and side plates are of double-wall design with openings cut out of the outer wall panel of each plate for heat dissipation and safety.

A pivoting mechanism comprised of a jack and a pivot bracket reside between vertical stanchions. One end of the jack is coupled to the base frame while its other end is coupled to the underside of the bottom plate at a point off center from a central axis of the container. The pillow block and rod assembly coupled to the stanchions are located such that the rod is along the central axis of the container. When the jack is extended, the container is in the horizontal position. However, when the jack is retracted by a hand crank coupled to the jack, the bottom plate of the container pivots along its central axis causing the container to rotate approximately 85–90 degrees into an almost vertical position. The container now resides within the width of the base frame of the cart, permitting the complete unit to be transported through a standard width doorway.

In operation, the particular equipment or assembly is loaded into the horizontally positioned base plate and secured. Side plates are assembled to form a container. The top cover plate is positioned onto the side plates to seal the container. The loading operation can be performed while the device is still hot in order to prevent contaminants flaking off when the device cools. The jack is used to rotate the container to its vertical position for transport to a servicing area.

Once at the servicing area, the container is again brought to its horizontal position. The top and side plates are removed completely such that the cart and the bottom plate function as a work bench. The device can then be dismantled, serviced and reassembled. Once reassembled, various diagnostic tests can be performed on the device while it is still in the service area.

BRIEF DESCRIPTION OF THE DRAWINGS

FIG. 3 is a side elevation view showing the placement of the turret in the fully assembled container housing atop the cart.

FIG. 4 is a top view of a closed container housing without the turret assembly atop the cart.

FIG. 5 is a side view of a closed container housing atop the cart.

FIG. 8 is a top view of the bottom plate of the container housing also showing one of the side plates.

FIG. 9 is a detail cross-sectional drawing of one of the side plate clamps clamped to the bottom plate.

FIG. 10 is a detail drawing showing the double-wall structure of the side plate of the container housing.

FIG. 11 is a cross-sectional view of the fully enclosed container housing also showing a mounting block and standoff plate for mounting the turret assembly of FIG. 1.

DETAILED DESCRIPTION OF THE PREFERRED EMBODIMENT

The present invention describes an apparatus for use in servicing a semiconductor processing equipment assembly in a cleanroom environment. In the following description numerous specific details are set forth, such as specific type of reactor, structure, shape, etc., in order to provide a thorough understanding of the present invention. It will be obvious, however, to one skilled in the art, that the present invention may be practiced without these specific details. In other instances, well-known methods and structures have not been set forth, in order not to unnecessarily obscure the present invention.

Figure 1:
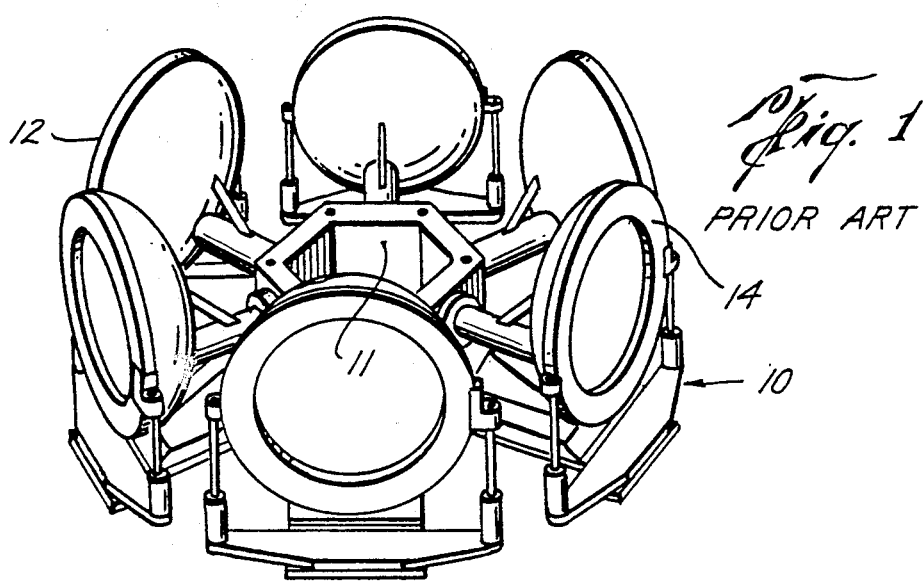
FIG. 1 is a pictorial illustration of a particular prior art semiconductor reactor turret assembly having six wafer processing heads.

Referring to FIG. 1, a reactor assembly 10 utilized for semiconductor processing is shown. Reactor 10 is commonly referred to as a turret assembly and includes a number of chucks 12 configured around a hub assembly 11. The particular turret assembly 10 illustrated in FIG. 1 is a six chuck reactor assembly, wherein the chucks 12 are configured in a hexagonal arrangement around the hexagonal shaped hub 11. The particular turret assembly 10 illustrated in FIG. 1 is manufactured by Genus Corporation of Mountain View, Calif. and sold under Model Number 8720/8710.

An assembled turret is installed into the process chamber of the Genus 8720/8710 system. Various gases are then fed into the process chamber and react to deposit a tungsten film. When placed in the equipment, each of the chucks 12 is coupled to receive a circular semiconductor wafer. The wafer resides behind the clamp ring 14 at the extreme outer periphery of each chuck of assembly 10. In this particular equipment, up to six semiconductor wafers can be processed, one by each chuck 12, for the deposition of tungsten.

Although a particular assembly 10 is shown in FIG. 1, it is shown for illustrative purpose only. It is to be appreciated that the present invention can be configured to function with a variety of semiconductor fabrication assemblies and equipment which are utilized in various processing functions.

Referring to FIGS. 2-7, an apparatus 20 of the present invention is shown. Apparatus 20, for purposes of simplicity is commonly referred to as a "cart". Further, because for this particular purpose, cart 20 has been designed to function in conjunction with the servicing of the above described turret assembly 10, apparatus 20 for exemplary purpose only, is commonly referred to as a "turret cart". The two main assemblies of cart 20 are a mobile support assembly 21 and an enclosed housing assembly 22. The enclosed housing assembly 22 can be disassembled.

Support assembly 21 is comprised of a base frame 25, vertical frame 26, handle 27, vertical support member 24 and pivoting mechanism 28. The base frame 25 is rectangular in shape having three parallel support bars 31a-c located interior of the rectangular shape of the frame and extending across the two opposing sides of the rectangular shape, such that the complete frame 25 is planar to the floor. Four wheels 29 are placed on the underside of frame 25 in order to provide for the mobility of cart 20. Wheels 29 of the preferred embodiment are plastic caster, pivoting wheels which can be locked to prevent any rolling movement.

The vertical frame 26 is comprised of two stanchions 32 which rise perpendicularly upward from the middle support bar 31b. A support bar 33 is coupled between each stanchion 32 to the outer edge of base frame 25 to provide an "A-frame" type support to retain stanchions 32 in the upright (vertical) position. A rod 35 extends across the upper end of the stanchions 32 and the ends of the rod 35 are anchored to the stanchions. The rod 35 passes through the central opening of two pillow blocks 36 which are used for supporting the housing assembly 22. Pillow blocks 36 each include bearings in order to permit rod 35 to rotate therein.

Positioned between the vertical frame members 26 is the pivoting mechanism 28. Pivoting mechanism 28 includes a worm gear driven jack 37, pivot bracket 38 and a hand crank 39. The crank 39 is coupled to jack 37 by the use of a double "U-joint" connecting rod 44. The mechanically operated jack 37 is positioned at one end coupled to a jack base 43, which is affixed to support bar 31a. An "A-frame" support bar 34 extends across support bars 31a and 31b to further support jack 37 at its lower end. The "A-frame" support bar 34 is pinned to the lower end of jack 37 to permit the lower end of jack 37 to swivel slightly during operation of the jack. The upper end of jack 37 is coupled to the housing assembly 22 by pivot bracket 38. A pin is used to couple the upper end of jack 37 to the pivot bracket 38 for rotation of housing assembly 22.

Handle 27 is comprised of two vertical bars 45 extending upward vertically from one edge of frame 25 adjacent to one end of bars 31. Bars 45, approximately midway up, then angle outward from the support assembly 21 and are terminated at the extremity by a horizontal bar 46, which is coupled across the two vertical bars 45.

The housing assembly 22 is comprised of a bottom plate 40, top plate 41, and a plurality of side plates 42, which are shown in more detail in FIGS. 8-11. In this particular example, because turret 10 is hexagonal, six side plates 42 are used to provide a hexagonal shaped housing to accommodate the hexagonal shaped turret 10. Furthermore, top plate 41 is actually comprised of two half-sections. Clamps 51 are utilized to clamp each side plate 42 onto the bottom plate 40. Clamps 53 are used to clamp each of the side plates to its adjacent side plates. Clamps 52 are also utilized to clamp the top plate 41 onto the side plates 42. Clamps 51-53 can be of a variety of well-known prior art devices utilized for the purpose of clamping the plates.

In this particular embodiment, each side plate includes two clamps 51 for clamping the side plate 42 onto the bottom plate 40. Only one clamp 53, located at the upper right corner of each plate 42, is used to couple that particular side plate 42 to its right adjacent plate. For each side plate 42, one clamp is used to couple it to the top plate 41. However, it is to be understood that the actual number of clamps which can be utilized is a mere design choice, as long as a fully enclosed container can be assembled by the coupling of the various plates 40-42. Furthermore, the side edges of the side plates 42 are beveled in order for the adjacent side plates 42 to join to form the hexagonal shape. An exemplary illustration for utilizing a clamp for clamping is shown in FIG. 9.

The top plate 41 and the side plates 42 are double walled, having a thicker outer panel and a thinner inner panel to form the double-wall. The panels are separated by screw spacers 55. A circular opening 56 is cut in the outer plate of each of the side plates 42. Two openings 57 are cut in the outer panel of the top plate 41, one opening 57 in each half of the plate 41. The purpose of the inner panel and the openings 56-57 in the outer panel are for heat dissipation. The double-wall design is utilized so that the outer panel remains cooler than the inner panel for purposes of safety to the operator.

The bottom plate 40 is affixed to the support assembly 22 by pillow blocks 36 and pivot bracket 38. Blocks 36 are affixed to the bottom plate 40 along a central axis 60 of bottom plate 40. Pivot bracket 38 is affixed off center from the central axis 60 so that the upper end of jack 37, when extended, provides the support to maintain the bottom plate 40 parallel to the floor. When the bottom plate is in this horizontal position, it also rests on the vertical support member 24. Support member 24 is located to provide support to the housing assembly 22 on the opposite side of the central axis 60 as the pivot bracket 38. A mounting block 49 and standoff plate 50 are provided on the interior of the bottom plate 40 for mounting the particular assembly which is to be serviced.

In operation, the turret cart 20, including the housing assembly 22 is wheeled adjacent to the particular equipment which is to be serviced. The housing assembly 22 is placed in the horizontal position with the jack 37 extended. The top plate 41 is removed. The side plates 42 are clamped in the assembled position. Once the particular subassembly has been detached or dismantled from its equipment, it is loaded into the housing assembly 22. In the particular example, a lifting spider 15 is screwed onto the hub 11 of turret 10. An "eye" bolt 13 on the lifting spider 15 provides for a place of attachment for removal of the turret 10. A hoist is used to lift the turret 10 out of its equipment by coupling the hoist cable to the eye bolt 13.

Although the removal of the turret 10 can be accomplished after it has cooled, the preferred method is to remove the turret 10 while it is still hot. An advantage of removing the turret 10 while it is hot is that less tungsten residue will flake off of the turret 10. It also saves time in performing the necessary maintenance, thereby reducing the "down time" of the equipment.

Once the turret 10 has been loaded into the housing assembly 22, it is secured to the bottom plate 40 by bolts 16. Holes are provided in the hub 11 of the turret 10, which are utilized for securing the turret 10 to its equipment. These same holes are now utilized to hold bolts 16 for securing the turret 10 to the bottom plate 40. It is to be noted that the turret 10 can be mounted first onto the bottom plate 40 prior to assembling the side plates 42.

Once the turret 10 is secured in housing assembly 22 with side plates 42 also assembled, the two halves of top plate 41 are placed onto the housing assembly 22 and secured to the side plates 42 by clamps 52. When the turret 10 is of sufficiently hot temperature, care must be observed in removing, placing and securing the turret 10 into the housing assembly 22. The double walls of the top and side plates 41 and 42 provide for heat dissipation from the interior of the housing assembly 22 while containing most of the particulates. The double-wall scheme along with the openings 56-57 allow for heat to be dissipated from the interior of the housing assembly 22 to the surrounding ambient environment, yet leaving the outer panel safer to touch.

The turret 10 is then transported to a desirable location for providing the necessary service. Typically, this maintenance facility is separate or isolated from the portion of the fab utilized for semiconductor fabrication. During transport, if cart 20 must necessarily pass through a doorway, it is possible that the width of the doorway may not permit the passage of the cart. For example, with the particular turret 10, the width of the housing assembly 22 in the horizontal position is larger than the width of a standard doorway. However, the pivoting mechanism 28 of the present invention permits the housing assembly 22 to be rotated, such that the cart 20 and the turret 10 can pass readily through such a doorway.

The hand crank 39 is utilized to manually retract the piston of the jack 37. As the jack 37 is retracted, that portion of the housing assembly 22 coupled to jack 37 is caused to pivot downward due to the rotation of rod 35. When fully retracted, the housing assembly 22 has been rotated approximately 85 to 90 degrees and a lower portion of the bottom plate 40 rests proximately along stanchion 32. In such a rotated position, the width of the housing unit is now determined substantially by the height of the side plates 42 wherein such dimension is less than that of the width of the support assembly 21.

Thus, cart 20 is now no wider then the width of the support assembly 21. Once the cart assembly 20 is transported to the desired location, the jack 37 is manipulated in the opposite direction to extend the piston, such that the housing assembly 22 is again in its horizontal position. It is to be appreciated that the actual amount of angular rotation of housing assembly 22 is a design choice.

Figure 2:
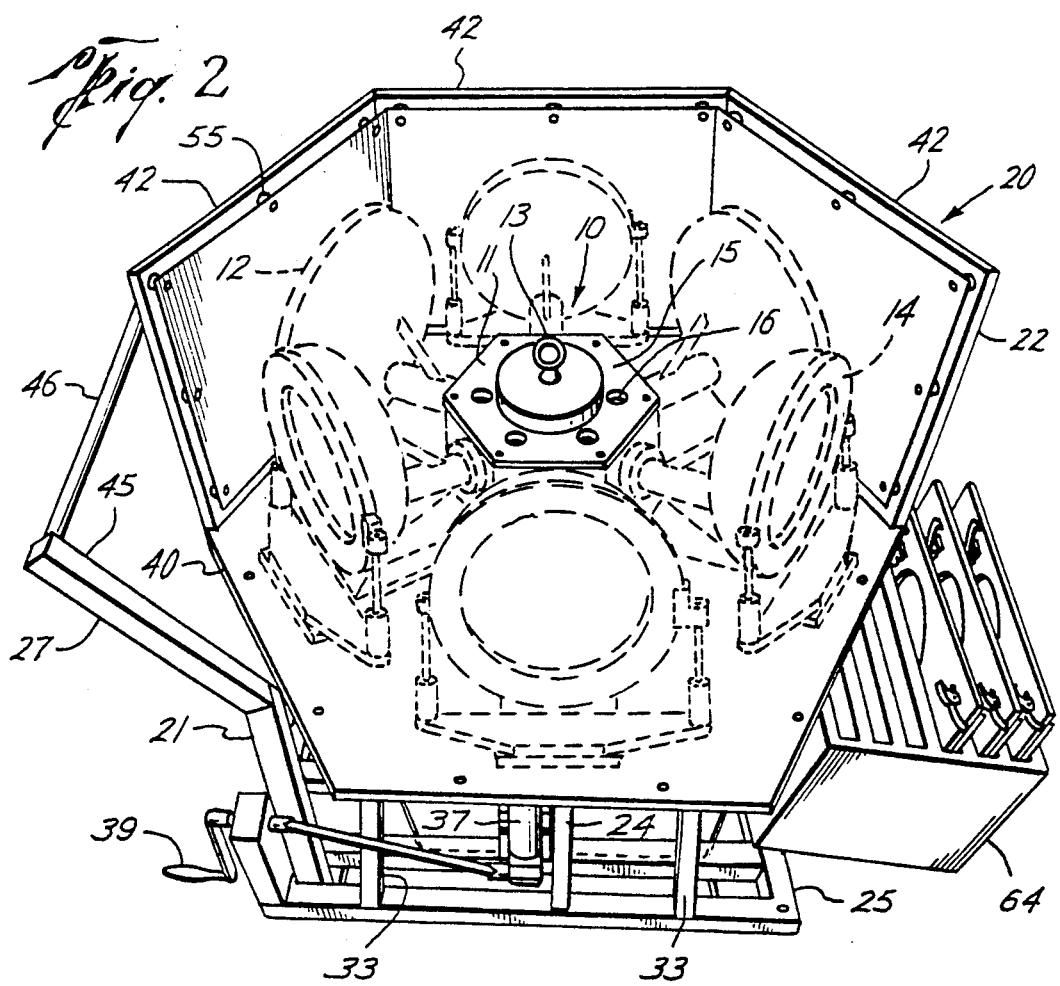
FIG. 2 is a pictorial illustration of an apparatus of the present invention showing the placement of the turret assembly in a partially assembled container housing which sits atop a mobile cart assembly.
Figure 6:
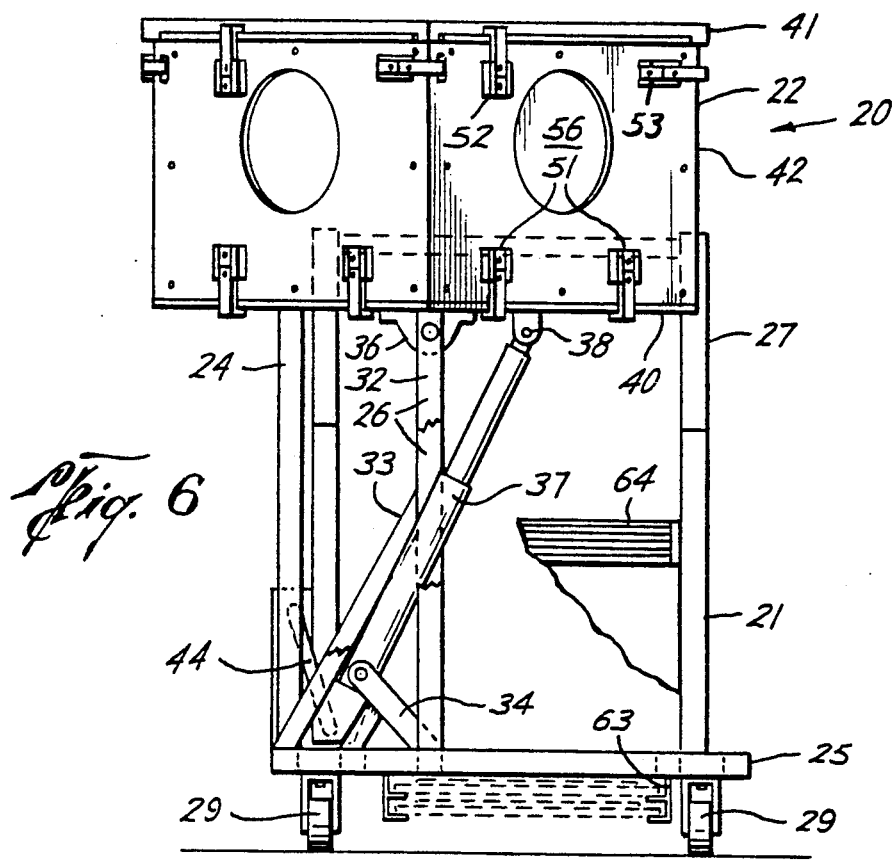
FIG. 6 is a front view of a closed container housing in a horizontal position atop the cart.
Figure 7:
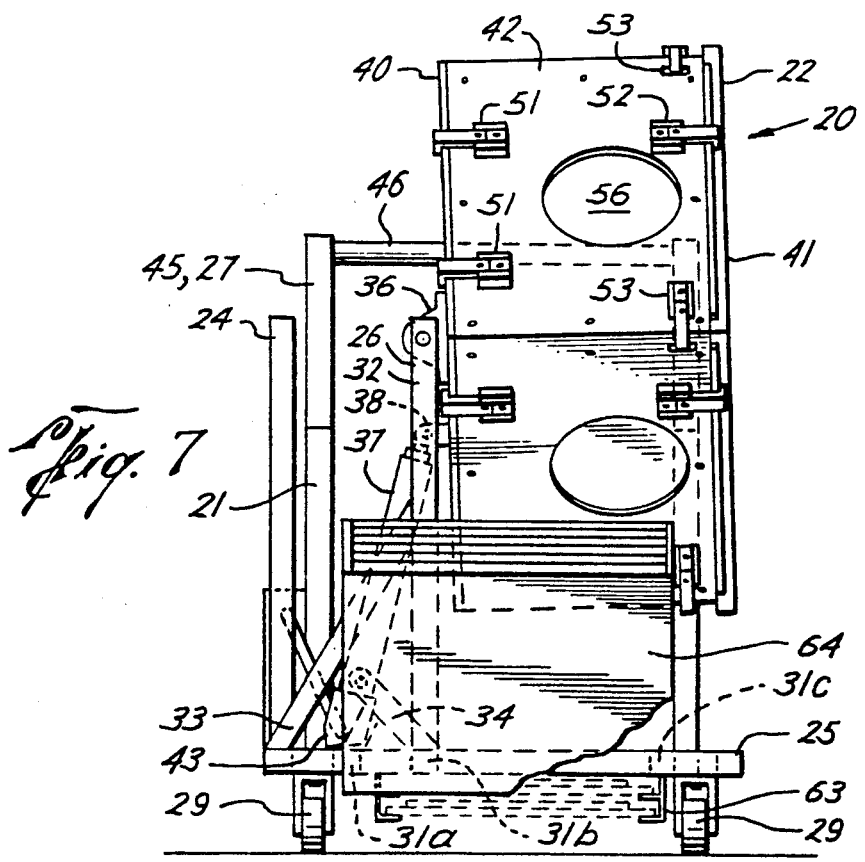
FIG. 7 is a front view of a closed container housing in a vertical position used for transporting.

In order to perform the service work on the turret 10, the top plate 41 and the side plates 42 are unclamped and removed. In actual practice, the preferred embodiment uses a two-piece double-walled top plate for top plate 41. This top plate 41 is comprised of two half-sections which mate along axis 60 to enclose the housing assembly 22. The two half sections of the top plate 41 are stored under the support assembly 21 by inserting it onto dual rails 63 located under the support assembly 21. Likewise, the side plates 42 are disassembled and stored in the slots 65 provided within box 64, which is attached to the support assembly 21. Box 64 is affixed to frame 25 at the opposite end from handle 27. A partially assembled or dismantled unit is shown in FIG. 2.

Once the top and side plates 41 and 42 have been disassembled, the turret 10 can be serviced. It is preferred that the assembly has cooled to room temperature or thereabouts in order not to present a temperature hazard to the maintenance personnel. Although the turret 10 can be removed from the bottom plate 40 for servicing, cart 20 has been designed to alleviate the need for such removal. The actual disassembly of the turret 10 can be achieved while the hub 11 is still mounted on the bottom plate 40. The cart 20 and the bottom plate 40 essentially operate as a work bench for servicing turret 20. After completion of the required service, turret 10 is reassembled on the cart. It can then be tested in order to determine if the turret 10 is ready for reinstallation into the equipment.

It is to be noted that in the prior art, the various diagnostic functions were necessarily performed at the location of the equipment since the turret 10 was disassembled and reassembled in the equipment. By utilizing the present invention, the various diagnostics, such as helium leak testing, can now be performed at a remote location from the equipment, thereby reducing the amount of contaminants which could be introduced into the cleanroom environment from such testing and the associated instruments and/or tools.

Although a variety of structurally sound materials can be used to construct cart 20, the preferred embodiment uses stainless steel for most components. Bottom plate 40 and assembly standoff plate 50 are fabricated from aluminum. The external panel of side plates 42 are aluminum while the inner panels are stainless steel. Both panels of the top plate 41 are made from stainless steel. Aluminum is utilized not to unnecessarily add weight to the device. The support assembly 21 is fabricated from stainless steel. The wheels 29 are polypropolene plastic and the box 64 is constructed from a sheet of polypropolene.

The dimensions of the various components will depend on the particular assembly to be serviced and, thus, is a design choice. However, it is preferred that the width of the cart be such that it can readily fit though a standard width doorway. The weight and size of any equipment or assembly used with the container cart will determine the actual dimensions and materials used to construct the container cart of the present invention. Instability and balance are of prime concern when the housing assembly is rotated into the vertical position. Furthermore, the material will also depend on the temperatures encountered. The apparatus of the present invention is capable of containing assemblies which are at temperatures in the range of 400°–490° C.

Thus, a container cart for servicing semiconductor equipment and assemblies is described.

We claim:

1. An apparatus for transporting an equipment assembly comprising:
   a mobile cart having an undercarriage with wheels disposed on its underside for mobility and having at least one vertical support member extending vertically upward from said undercarriage;
   a housing having a bottom plate, a plurality of removable side plates and a removable top cover plate disposed to form a fully enclosed container when all said plates are coupled together in order to house said equipment assembly, said housing coupled to and supported by said vertical support member;
   each of said side plates are of double-walled construction having a thinner inner panel and a thicker outer panel wherein said outer panel has openings for dissipating heat from an interior of said container;
   said housing for fully encasing said equipment assembly at a temperature in excess of 400 degrees centigrade and for transporting said equipment;
   said top and side plates being removable for accessing and servicing said equipment assembly.

2. The apparatus of claim 1 wherein said top cover plate is also of said double-walled construction.

3. The apparatus of claim 2 further including pivoting means coupled to said cart and said housing for pivoting said housing relative to said cart.

4. An apparatus for transporting a semiconductor processing equipment assembly comprising:
   a mobile cart having an undercarriage with wheels disposed on its underside for mobility and having vertical support members extending vertically upward from said undercarriage;
   a housing having a bottom plate, a plurality of removable side plates and a removable top cover plate disposed to form a fully enclosed container when all said plates are mechanically coupled together in order to house said equipment assembly, said housing coupled to and supported by said vertical support members;
   each of said side plates are of double-walled construction having a thinner inner panel and a thicker outer panel wherein said outer panel has openings for dissipating heat from an interior of said container;
   pivoting means coupled to an underside of said bottom plate and to said cart for being operative to rotate said housing from its horizontal position in order to transport said equipment assembly.

5. The apparatus of claim 4 wherein said top cover plate is also of said double-walled construction.

6. The apparatus of claim 5 wherein said pivoting means includes a jack coupled to the underside of said bottom plate but proximal to a periphery of said bottom plate, such that when said jack is either extended or retracted, said bottom plate moves correspondingly to pivot said housing about a stationary axis.

7. The apparatus of claim 6 wherein said jack includes a hand crank for manual operation.

8. The apparatus of claim 7 wherein said housing is constructed from material capable of housing said equipment assembly at temperatures of approximately 400°–490° C.

9. An apparatus for transporting a semiconductor processing equipment assembly comprising:
- a mobile cart having a substantially planar base frame horizontally disposed as an undercarriage with wheels disposed on its underside for mobility and having two vertical support members extending vertically upward from said base frame;
- a housing having a bottom plate, a plurality of removable side plates and a removable top cover plate disposed to form a fully enclosed container when all said plate are mechanically coupled together in order to house equipment assembly;
- a rod disposed across upper end of said two vertical support members;
- a block and bearing assembly affixed to an underside of said bottom plate and having said rod disposed through it for rotating said housing about said rod;
- a jack having one end coupled to the underside of said bottom plate at a location distant from an axis formed by said rod and its opposite end coupled to said base frame for pivoting said housing about said rod;
- said jack for maintaining said housing in a horizontal position when said jack is in its extended position, but as said jack is retracted, said jack causes said housing to rotate approximately 85–90 degrees from its horizontal position; said horizontal position of said housing for loading said equipment assembly and its rotated position for transporting said equipment assembly.

10. The apparatus of claim 9 wherein each of said side plates are of double-walled construction having a thinner inner panel and a thicker outer panel wherein said outer panel has openings for dissipating heat from an interior of said container.

11. The apparatus of claim 10 wherein said top cover plate is also of said double-walled construction.

12. The apparatus of claim 11 wherein said jack includes a hand crank coupled to said opposite end proximal to said base frame for providing manual operation of said jack.

13. The apparatus of claim 12 wherein said top cover plate is comprised of separatable two half-sections.

14. The apparatus of claim 13 wherein all of said plates are coupled together by mechanical clamps.

15. The apparatus of claim 13 wherein said bottom plate, and outer panels of said side plates are fabricated from aluminum and said top cover plates and said inner panels of said side plates are fabricated from stainless steel.

16. The apparatus of claim 14 wherein said housing is constructed from material capable of housing said equipment assembly at temperatures of approximately 400°–490° C.

17. The apparatus of claim 9 wherein said housing is constructed from material capable of housing said equipment assembly at temperatures of approximately 400°–490° C.

* * * * *

UNITED STATES PATENT AND TRADEMARK OFFICE
CERTIFICATE OF CORRECTION

PATENT NO. : 5,186,597
DATED : February 16, 1993
INVENTOR(S) : J. Charles Bulsterbaum et al.

It is certified that error appears in the above-identified patent and that said Letters Patent is hereby corrected as shown below:

Column 9, line 16, insert --said-- between "house" and "equipment".

Signed and Sealed this

Twenty-eighth Day of June, 1994

Attest:

BRUCE LEHMAN

Attesting Officer     Commissioner of Patents and Trademarks